(12) United States Patent
Matsuda (10) Patent No.: US 11,744,046 B2
(45) Date of Patent: Aug. 29, 2023

(54) SEMICONDUCTOR STORAGE DEVICE

(71) Applicant: KIOXIA CORPORATION, Tokyo (JP)

(72) Inventor: Yoshiharu Matsuda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/191,317

(22) Filed: Mar. 3, 2021

(65) Prior Publication Data

US 2022/0087072 A1 Mar. 17, 2022

(30) Foreign Application Priority Data

Sep. 16, 2020 (JP) ................................. 2020-155472

(51) Int. Cl.
| | |
|---|---|
| *H05K 7/20* | (2006.01) |
| *H01L 23/367* | (2006.01) |
| *H01L 25/18* | (2023.01) |
| *H05K 1/18* | (2006.01) |
| *H01R 12/71* | (2011.01) |

(52) U.S. Cl.
CPC ..... *H05K 7/20445* (2013.01); *H01L 23/3675* (2013.01); *H01L 25/18* (2013.01); *H05K 1/181* (2013.01); *H05K 7/20509* (2013.01); *H01R 12/716* (2013.01); *H05K 2201/10015* (2013.01); *H05K 2201/10159* (2013.01); *H05K 2201/10189* (2013.01)

(58) Field of Classification Search
CPC ............... H05K 7/20445; H05K 1/181; H05K 7/20509; H05K 2201/10015; H05K 2201/10159; H05K 2201/10189; H01L 23/3675; H01L 25/18; H01R 12/716
See application file for complete search history.

(56) References Cited

U.S. PATENT DOCUMENTS

| | | | | |
|---|---|---|---|---|
| 3,766,439 | A * | 10/1973 | Isaacson ............ | H05K 7/20545 174/254 |
| 4,756,081 | A * | 7/1988 | Penn ..................... | H05K 1/0204 257/713 |
| 4,853,828 | A * | 8/1989 | Penn ..................... | H05K 1/0204 174/16.3 |
| 5,243,218 | A * | 9/1993 | Zenitani ............. | H05K 7/20436 257/730 |
| 5,659,459 | A * | 8/1997 | Wakabayashi ......... | B41J 29/377 361/753 |
| 6,188,579 | B1 * | 2/2001 | Buondelmonte ... | H01L 23/3677 257/E23.105 |
| 6,226,179 | B1 * | 5/2001 | Lee ..................... | H05K 7/1431 361/698 |
| 6,818,477 | B2 * | 11/2004 | Veitschegger ......... | H05K 3/429 438/122 |

(Continued)

FOREIGN PATENT DOCUMENTS

TW 201108925 A 3/2011

*Primary Examiner* — Michael A Matey
(74) *Attorney, Agent, or Firm* — Kim & Stewart LLP (57) ABSTRACT

A semiconductor storage device includes a housing, a first substrate disposed in the housing and on which one or more first electronic components are mounted, a plurality of heat radiating plates arranged in the housing above the first substrate along a thickness direction of the first substrate, and one or more connectors that connect the first substrate and the plurality of heat radiating plates.

16 Claims, 8 Drawing Sheets

(56) References Cited

U.S. PATENT DOCUMENTS

| | | | |
|---|---|---|---|
| 7,468,555 B2* | 12/2008 | Chen | G06F 1/20 257/722 |
| 8,787,022 B2* | 7/2014 | Moriai | H05K 1/02 174/547 |
| 9,078,357 B2* | 7/2015 | Gunderson | H05K 5/0269 |
| 9,507,108 B2* | 11/2016 | Aoki | G02B 6/4269 |
| 10,085,364 B2 | 9/2018 | Voss | |
| 10,199,904 B2* | 2/2019 | Sasaki | H05K 1/09 |
| 10,289,174 B2 | 5/2019 | Kim | |
| 10,622,281 B2* | 4/2020 | Degrenne | H01L 21/4882 |
| 10,885,623 B2* | 1/2021 | Jung | G06T 7/0008 |
| 2003/0067754 A1 | 4/2003 | Bauer | H05K 7/205 361/760 |
| 2006/0133049 A1* | 6/2006 | Hagiwara | H01L 23/4338 361/720 |
| 2006/0268511 A1* | 11/2006 | Jeong | H05K 7/20963 361/690 |
| 2008/0038877 A1* | 2/2008 | Wang | G06F 12/1416 700/95 |
| 2010/0265658 A1 | 10/2010 | Sawai et al. | |
| 2011/0199748 A1* | 8/2011 | Kagawa | H05K 7/20436 361/796 |
| 2012/0250279 A1* | 10/2012 | Harashima | H05K 1/144 361/760 |
| 2014/0022733 A1* | 1/2014 | Lim | H05K 7/20445 361/718 |
| 2014/0146461 A1* | 5/2014 | Choi | G06F 1/203 361/752 |
| 2015/0131242 A1 | 5/2015 | Kim et al. | |
| 2016/0344098 A1* | 11/2016 | Ming | H01Q 21/0087 |
| 2017/0060199 A1* | 3/2017 | Kim | G06F 1/20 |
| 2017/0188477 A1* | 6/2017 | Matsuda | H05K 1/144 |
| 2018/0242469 A1* | 8/2018 | Suzuki | H05K 7/20472 |
| 2018/0270943 A1* | 9/2018 | Suzuki | H05K 7/20009 |
| 2018/0270991 A1* | 9/2018 | Suzuki | H05K 5/0008 |
| 2019/0182985 A1* | 6/2019 | Gaviola | H05K 7/20409 |
| 2019/0278343 A1 | 9/2019 | Cinar et al. | |
| 2021/0289667 A1* | 9/2021 | Shih | H05K 7/20445 |

\* cited by examiner

SEMICONDUCTOR STORAGE DEVICE

CROSS-REFERENCE TO RELATED APPLICATIONS

This application is based upon and claims the benefit of priority from Japanese Patent Application No. 2020-155472, filed Sep. 16, 2020, the entire contents of which are incorporated herein by reference.

FIELD

Embodiments described herein relate generally to a semiconductor storage device.

BACKGROUND

A semiconductor storage device of a certain type includes a housing, a substrate accommodated inside the housing, and a semiconductor memory component mounted on the substrate. Such a semiconductor storage device generally requires improved heat radiating performance or the like.

DETAILED DESCRIPTION

Embodiments provide semiconductor storage devices having improved heat radiation performance.

In general, according to one embodiment, a semiconductor storage device includes a housing, a first substrate disposed in the housing and on which a first electronic component is mounted, a plurality of heat radiating plates. The heat radiating plates are arranged in the housing above the first substrate along a thickness direction of the first substrate, and one or more connectors that connect the first substrate and the plurality of heat radiating plates.

Hereinafter, semiconductor storage devices according to example embodiments will be described with reference to the drawings. In the following description, components having the same or substantially similar functions are designated by the same reference numerals. Furthermore, a description of those components previously described in conjunction with one drawing may be omitted from the description of subsequent drawings and/or embodiments.

In the present specification, the term "parallel" includes the case of the "substantially parallel". In the present specification, the term "orthogonal" includes the case of the "substantially orthogonal". In the present specification, the term "facing" means that at least a part of two members overlaps when viewed from at least one direction. In the present specification, the term "connection" includes not only the case where two members are directly adjacent and connected to each other without any intervening members therebetween but also the case where another connective member or component is interposed between the two "connected" members. Further, the term "contacting" as used herein means that two members are directly adjacent to each other without any intervening members therebetween.

The X direction, the Y direction, and the Z direction are defined in several of the drawings. For example, the X direction and the Y direction intersect each other along a first surface 40a of a child substrate 40 (see FIG. 2).

The X direction is a general term covering both the +X direction and the −X direction. The +X direction is, for example, a direction from a second side wall 18b of the housing 2 toward a first side wall 18a (see FIG. 2). In the following, the +X direction is referred to as "+X" for convenience. The −X direction is a direction opposite to +X. In the following, the −X direction is referred to as "−X" for convenience. When +X and −X are not required to be distinguished, it is simply referred to as "X direction".

The Y direction is a general term for covering both the +Y direction and the −Y direction. The +Y direction is a direction from a DRAM (dynamic random access memory) 32A toward a controller 31 (see FIG. 3). In the following, the +Y direction is referred to as "+Y" for convenience. The −Y direction is a direction opposite to +Y. In the following, the −Y direction is referred to as "−Y" for convenience. When +Y and −Y are not required to be distinguished, it is simply referred to as "Y direction".

The Z direction is a direction that intersects the X direction and the Y direction. The Z direction is a general term for covering both the +Z direction and the −Z direction. The +Z direction is, for example, a direction from a base side substrate module 3 toward a cover side substrate module 4 (see FIG. 2). In the following, the +Z direction is referred to as "+Z" for convenience. The −Z direction is a direction opposite to +Z. In the following, the −Z direction is referred to as "−Z" for convenience. When +Z and −Z are not required to be distinguished, it is simply referred to as "Z direction". The Z direction is the thickness direction of each of a main substrate 30, the child substrate 40, and a substrate 110.

First Embodiment

A semiconductor storage device 1 of a first embodiment is a storage device such as, for example, a solid state drive (SSD). The semiconductor storage device 1 can be attached to an information processing device, such as a server device or a personal computer. The semiconductor storage device 1 is used as a storage area of the information processing device. Here, the information processing device to which the semiconductor storage device 1 is attached can be referred to as a host device.

The semiconductor storage device 1 includes a housing 2, a base side substrate module 3, a cover side substrate module 4, and a heat radiating module 5. The cover side substrate module 4 may be referred to as "the first substrate module".

The heat radiating module 5 is located on the +Z side of the cover side substrate module 4.

Figure 1:
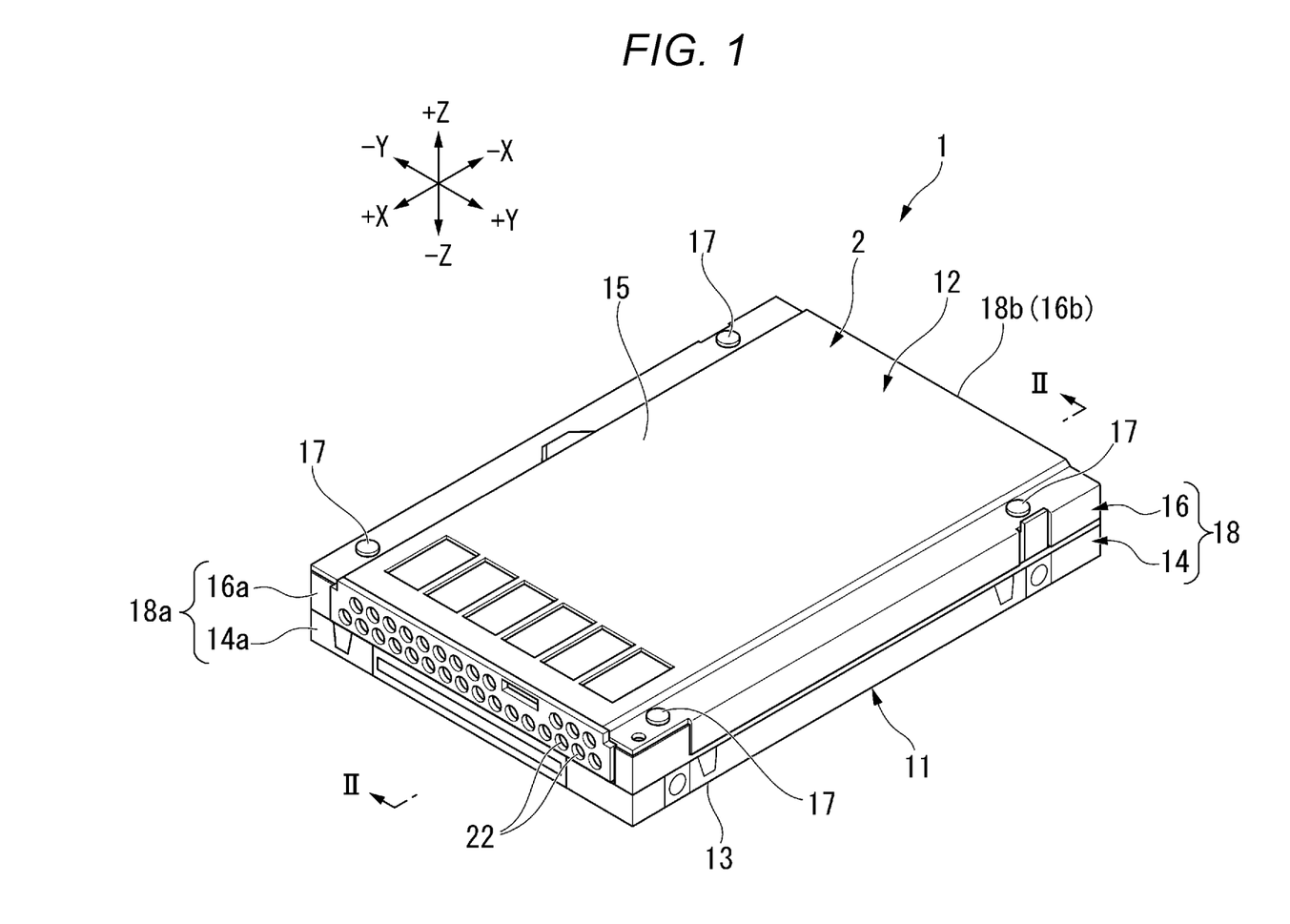
FIG. 1 is a perspective view illustrating a semiconductor storage device according to a first embodiment.

Next, the housing 2 will be described. FIG. 1 is a perspective view illustrating the semiconductor storage device 1.

The housing 2 is an outer frame of the semiconductor storage device 1. The housing 2 has, for example, a box shape. The housing 2 is made of metal, for example. The housing 2 may include a plurality of members.

The housing 2 includes a base 11 and a cover 12. The housing 2 is formed by combining the base 11 and the cover 12 in the Z direction. The base 11 and the cover 12 are fastened with a fastening member 17. The fastening member 17 is, for example, a screw.

The base 11 has a box shape that is open toward the cover 12, i.e., +Z. The base 11 includes a second main wall 13 and a first peripheral wall 14. The second main wall 13 has a rectangular planar shape with the X direction as its longitudinal (length) direction, the Y direction as its lateral (width) direction, and the Z direction as its thickness direction. The second main wall 13 is located closest to the −Z side of the base 11. The second main wall 13 has four end portions. The four end portions of the second main wall 13 are the end portions on the +X side, the −X side, the +Y side, and the −Y side. The first peripheral wall 14 extends along +Z (i.e., toward the cover 12) from each of the three end portions of the second main wall 13 except the end portion on the −X side thereof. That is, the first peripheral wall 14 extends along +Z from each of the end portion of the second main wall 13 on the +X side, the end portion of the second main wall 13 on the +Y side, and the end portion of the second main wall 13 on the −Y side.

The cover 12 has a box shape that is open toward the base 11, i.e., −Z. The cover 12 includes a first main wall 15 and a second peripheral wall 16. The first main wall 15 has a rectangular planar shape with the X direction as its longitudinal (length) direction, the Y direction as its lateral (width) direction, and the Z direction as its thickness direction. The first main wall 15 is located closest to the +Z side of the cover 12. The first main wall 15 wall 15 faces the second main wall 13 in the Z direction. The first main wall 15 has four end portions. The four end portions of the first main wall 15 are the end portions on the +X side, the −X side, the +Y side, and the −Y side. The second peripheral wall 16 extends from each of the four end portions of the first main wall 15 along −Z.

Figure 2:
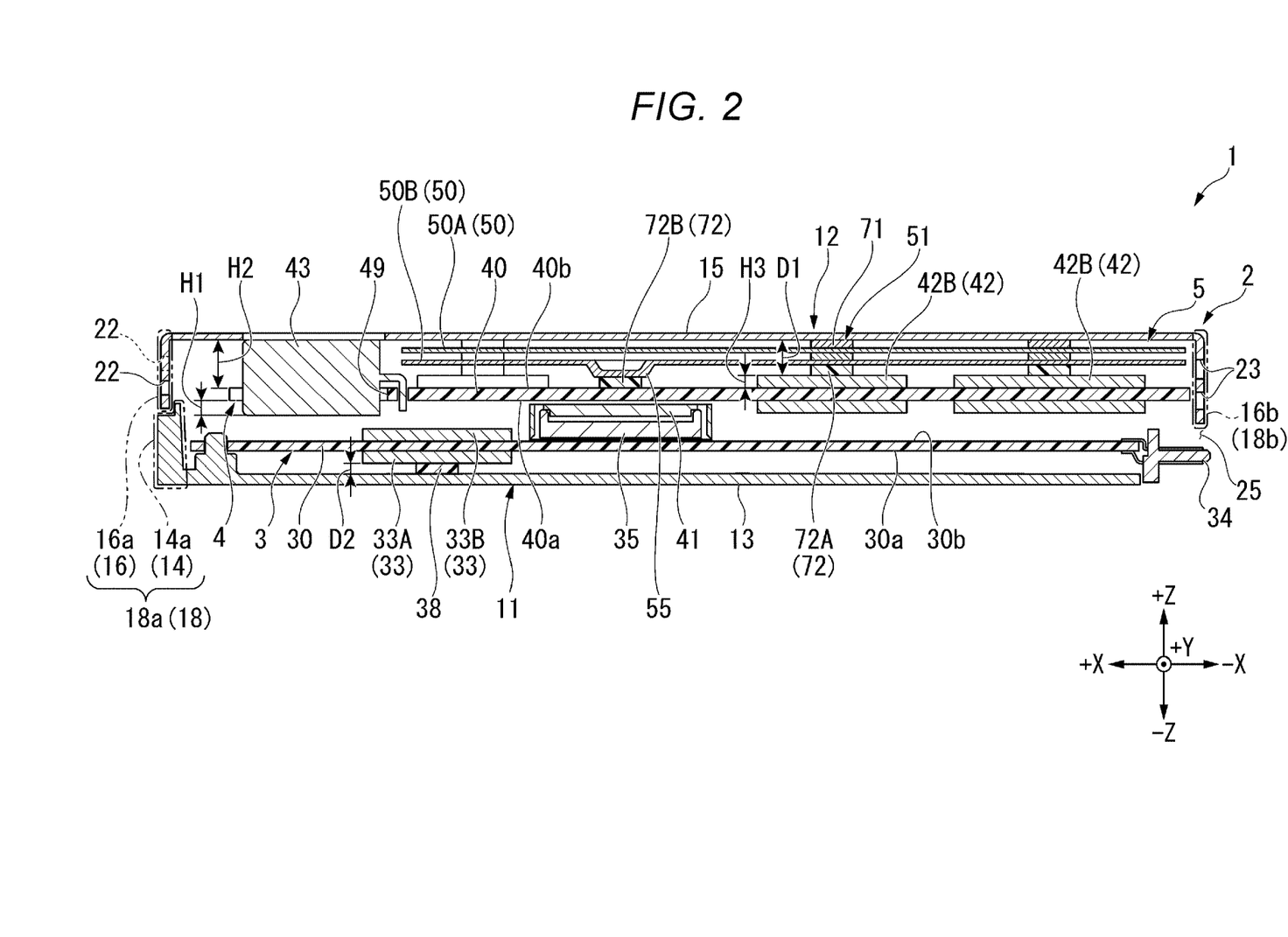
FIG. 2 is a cross-sectional view taken along the line II-II in FIG. 1.

The structure of the housing 2 will be described in more detail. FIG. 2 is a cross-sectional view taken along the line II-II in FIG. 1.

The first peripheral wall 14 of the base 11 and the second peripheral wall 16 of the cover 12 make up the peripheral wall 18 of the housing 2. The +X side of the peripheral wall 18 is referred to as a first side wall 18a. The first side wall 18a has a plate shape extending along the Y direction and the Z direction. The first side wall 18a includes a first part 14a and a second part 16a. The first part 14a is located on the +X side of the first peripheral wall 14 with respect to the second main wall 13. The second part 16a is located on the +X side of the second peripheral wall 16 with respect to the first main wall 15. A plurality of first communication holes 22 are formed in the first side wall 18a.

The −X side of the peripheral wall 18 is referred to as a second side wall 18b. The second side wall 18b has a plate shape extending along the Y direction and the Z direction. The second side wall 18b includes a third part 16b located on the −X side of the second peripheral wall 16 with respect to the first main wall 15. The third part 16b is located on the −X side of the second peripheral wall 16 with respect to the first main wall 15. A plurality of second communication holes 23 are formed in the second side wall 18b.

The first communication hole 22 is a ventilation hole that penetrates the first side wall 18a in the X direction. The inside and the outside of the housing 2 communicate with each other through the first communication hole 22. More specifically, the first communication hole 22 is formed in the second part 16a of the first side wall 18a. A plurality of first communication holes 22 are formed on the first side wall 18a at intervals in the Y direction and the Z direction.

The second communication hole 23 is a ventilation hole that penetrates the second side wall 18b in the X direction. The inside and the outside of the housing 2 communicate with each other through the second communication hole 23. More specifically, the second communication hole 23 is formed in the third part 16b of the second side wall 18b. A plurality of second communication holes 23 are formed on the second side wall 18b at intervals in the Y direction and the Z direction.

One of the first communication hole 22 and the second communication hole 23 may function as an air intake hole and may function as an air exhaust hole. For example, when the semiconductor storage device 1 is placed in an environment in which air flows from the +X side to the −X side, the air outside the housing 2 flows into the housing 2 through the first communication hole 22, and is exhausted to the outside of the housing 2 through the second communication hole 23. When the semiconductor storage device 1 is placed in an environment in which air flows from the −X side to the +X side, the air outside the housing 2 flows into the housing 2 through the second communication hole 23, and is exhausted to the outside of the housing 2 through the first communication hole 22. In the following, a case where the semiconductor storage device 1 is placed in an environment in which the air flows from the +X side to the −X side will be described.

Further, a connection port 25 is formed in the second side wall 18b. More specifically, the connection port 25 is formed in a part of the second side wall 18b that constitutes the first peripheral wall 14. The connection port 25 is an opening larger than the first communication hole 22 and the second communication hole 23. The connection port 25 is located more −Z side than the second communication hole 23. The connection port 25 is an opening that exposes an external connector 34, which will be described later, to the outside of the housing 2.

Figure 3:
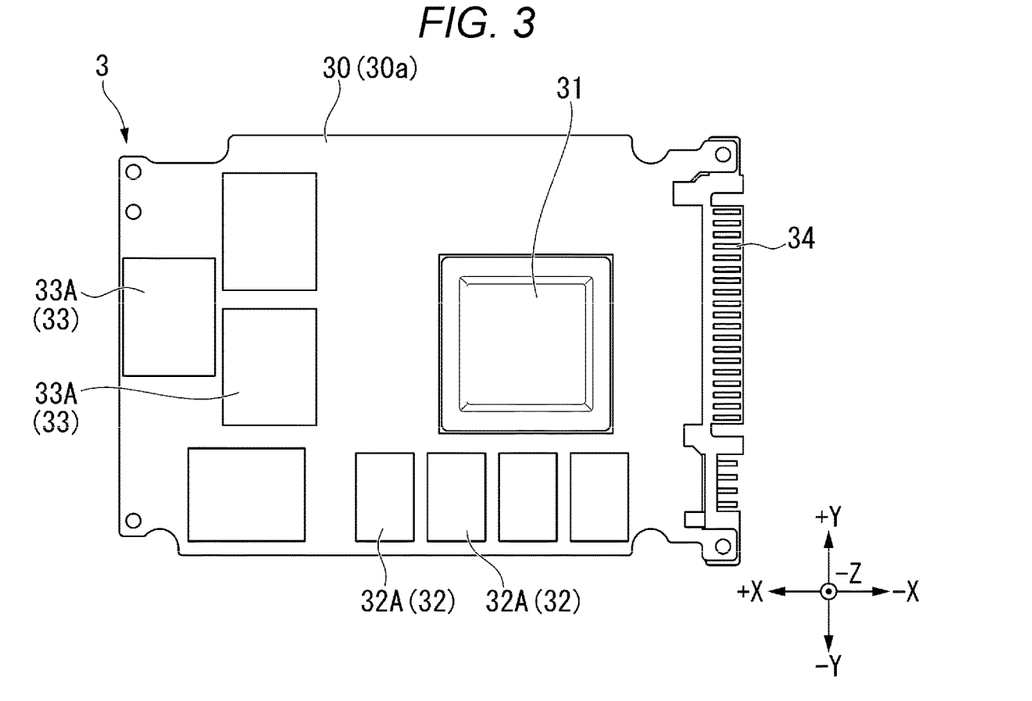
FIG. 3 is a bottom view of a base side substrate module of a first embodiment.
Figure 4:
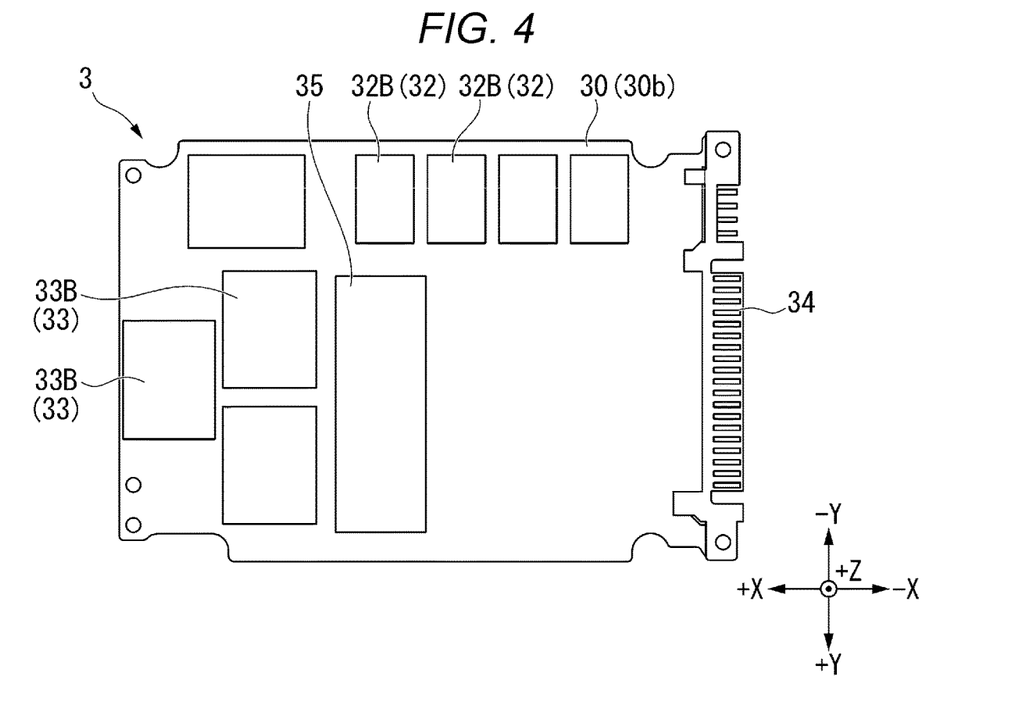
FIG. 4 is a plan view of a base side substrate module according to a first embodiment.

Next, a base side substrate module 3 will be described. FIG. 3 is a bottom view of the base side substrate module 3, and FIG. 4 is a plan view of the base side substrate module 3.

The base side substrate module 3 is an electronic circuit mounting substrate. The base side substrate module 3 is located on the −Z side with respect to a cover side substrate module 4.

The base side substrate module 3 includes a main substrate 30, a controller 31, a plurality of DRAM 32, a plurality of NAND flash memories (NAND) 33, the external connector 34, and an internal connector 35.

The main substrate 30 is, for example, a printed wiring substrate. The main substrate 30 has a plate shape with the X direction as its longitudinal (length) direction, the Y direction as its lateral (width) direction, and the Z direction as its thickness direction. Any number of electronic components can be mounted on the main substrate 30. The main substrate 30 is disposed in the housing 2. The main substrate 30 is fixed to the base 11 with screws or the like. The main substrate 30 includes a first surface 30a and a second surface 30b. The first surface 30a faces the second main wall 13. The first surface 30a is a surface on the −Z side. The second surface 30b is located on the opposite side of the first surface 30a. The second surface 30b faces the cover side substrate module 4. The second surface 30b is a surface on the +Z side.

The controller 31 is a system on a chip (SoC). The controller 31 controls operations performed by the semiconductor storage device 1. The amount of heat generated by the controller 31 is larger than the DRAM 32 and the NAND 33. In the example illustrated in FIG. 3, the controller 31 is mounted on a central portion of the first surface 30a of the main substrate 30. The controller 31 is located between one or more NANDs 33 and the external connector 34 in the X direction.

The DRAM 32 is a data buffer. The DRAM 32 is a volatile semiconductor memory. The DRAM 32 one example of an electronic component. The DRAM 32 is also an example of a semiconductor memory component. Write data received from the host device and/or read data read from the NAND 33 is temporarily stored in the DRAM 32. There are two types of DRAMs 32, a DRAM 32A and a DRAM 32B. The DRAM 32A is mounted on the first surface 30a. The DRAM 32B is mounted on the second surface 30b.

The NAND 33 is a non-volatile semiconductor memory chip. The NAND 33 is one example of an electronic component. The NAND 33 is also an example of a semiconductor memory component. There are two types of NANDs in the plurality of NANDs 33, a NAND 33A type and a NAND 33B type. A NAND 33A is mounted on the first surface 30a. A NAND 33B is mounted on the second surface 30b.

The external connector 34 connects the semiconductor storage device 1 and the host device to each other. The external connector 34 is formed on the −X side of the main substrate 30. As illustrated in FIG. 2, the external connector 34 is exposed to the outside of the housing 2 through the connection port 25 in a state where the base side substrate module 3 is accommodated in the housing 2. The external connector 34 includes a plurality of connection terminals. The plurality of connection terminals are arranged along the Y direction. The plurality of connection terminals are exposed on the first surface 30a and the second surface 30b of the main substrate 30.

The internal connector 35 is a so-called substrate-to-substrate connector or B to B connector. The internal connector 35 is mounted at the center of the second surface 30b of the main substrate 30, for example. The internal connector 35 includes a plurality of connection terminals connected to the internal connector 41 to be described later.

As illustrated in FIG. 2, the base side substrate module 3 is in contact with a first main wall 13 via a plurality of base side buffer portions 38. The base side buffer portion 38 is a so-called thermal interface material (TIM). The base side buffer portion 38 has a buffering function and a heat radiating function or heat conduction function. The base side buffer portion 38 is made of a material (for example, a resin material or the like) that has an excellent heat conduction quality and greater elasticity than the controller 31, DRAM 32, and NAND 33. The base side buffer portion 38 is made of a material having a higher heat conductivity than, for example, the main substrate 30 and the child substrate 40. The base side buffer portion 38 is formed in a sheet shape having a thickness in the Z direction. The base side buffer portion 38 is interposed between the controller 31 and the second main wall 13, between the DRAM 32A and the second main wall 13, between the NAND 33A and the second main wall 13, and between various other electronic components and the second main wall 13. The base side buffer portion 38 may be, for example, grease or an adhesive or the like. Each of the controller 31, DRAM 32A, and NAND 33A is thermally connected to the second main wall 13 via the base side buffer portion 38. The base side buffer portion 38 may be interposed between the first surface 30a of the main substrate 30 and the second main wall 13 and may thermally connect the first surface 30a of the main substrate 30 to the second main wall 13.

Figure 5:
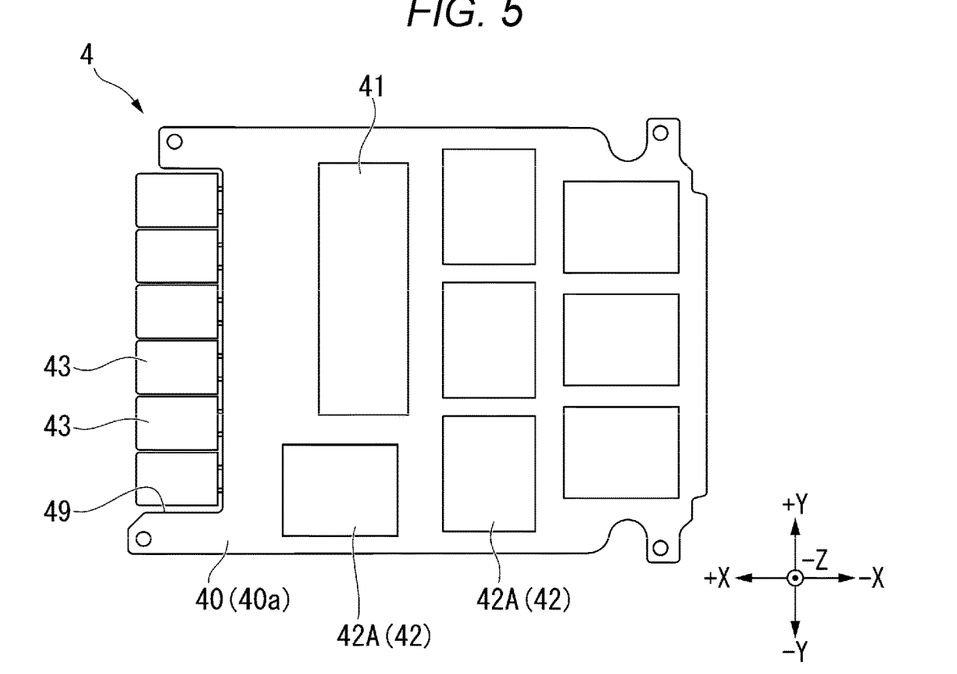
FIG. 5 is a bottom view of a cover side substrate module according to a first embodiment.

Next, the cover side substrate module 4 will be described. FIG. 5 is a bottom view of the cover side substrate module 4.

The cover side substrate module 4 is an electronic circuit mounting substrate. The cover side substrate module includes, for example, the child substrate 40, the internal connector 41, a plurality of NANDs 42, and a plurality of capacitors 43.

The child substrate 40 is, for example, a printed wiring substrate. The child substrate 40 may be referred to as the "first substrate". The child substrate 40 has a plate shape with the X direction as its longitudinal (length) direction, the Y direction as its lateral (width) direction, and the Z direction as its thickness direction. Any number of electronic components may be mounted on the child substrate 40. The child substrate 40 is disposed in the housing 2. The child substrate 40 is disposed in parallel with the main substrate 30. The child substrate 40 is fixed to the base 11 with screws or the like. A notch 49 is formed at the end of the child substrate 40 on the +X side. The notch 49 penetrates the child substrate 40 in the Z direction and is opened to the +X side. The child substrate 40 includes a first surface 40a and a second surface 40b. The first surface 40a faces the base side substrate module 3. The first surface 40a is a surface on the −Z side. The second surface 40b faces first main wall 15. The second surface 40b is located on the opposite side of the first surface 40a. The second surface 40b is a surface on the +Z side.

The internal connector 41 is connected to the internal connector 35 of the base side substrate module 3. The internal connector 41 includes a plurality of connection terminals. The internal connector 41 is mounted at the center of the first surface 40a of the child substrate 40, for example.

Figure 6:
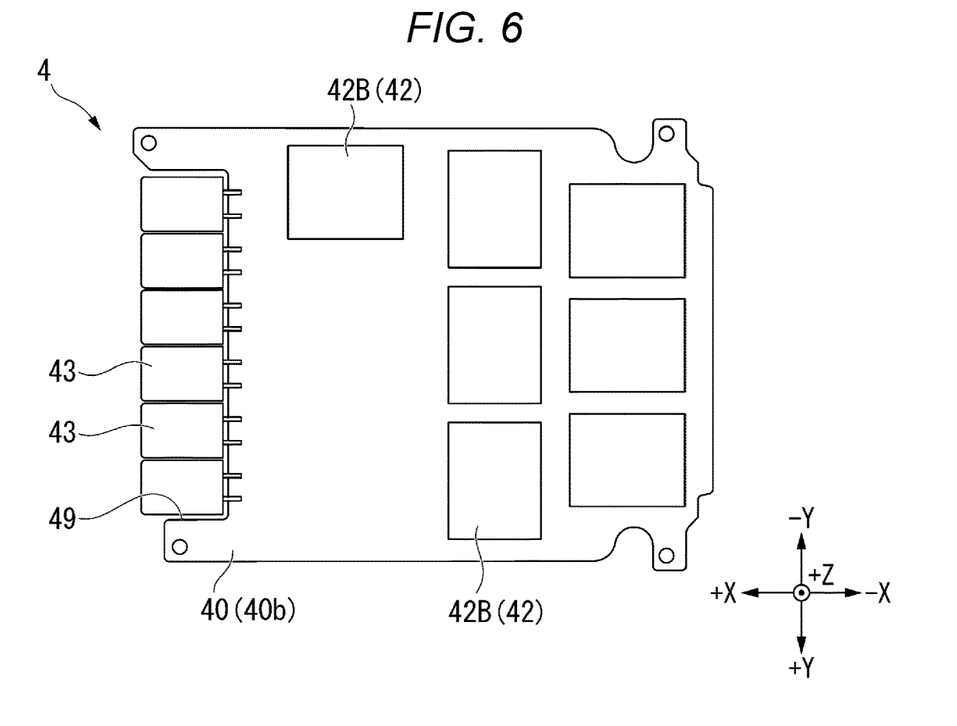
FIG. 6 is a plan view of a cover side substrate module according to a first embodiment.

The NAND 42 is a non-volatile semiconductor memory. There are two types of NANDs 42, a NAND 42A and a NAND 42B. The NAND 42A is mounted on the first surface 40a of the child substrate 40. The NAND 42B is mounted on the second surface 40b of the child substrate 40.

The capacitor 43 has a power source backup function. The capacitor 43 is, for example, an aluminum electrolytic capacitor or a conductive polymer tantalum solid electrolytic capacitor. For example, the capacitor 43 supplies power to the controller 31, the DRAM 32, the NAND 33, and the NAND 42 when the power supply from the host device is unexpectedly cut off. For example, the capacitor 43 supplies power to the controller 31, the DRAM 32, the NAND 33, and the NAND 42 until the data temporarily stored in the DRAM 32 is stored in the NAND 33 or the NAND 42. The capacitor 43 has a circular columnar shape, the axis of which extends along the X direction. The thickness of the capacitor 43 in the Z direction is large as compared with the thickness of the NAND 42 in the Z direction. For example, the thickness of the capacitor 43 in the Z direction is two times or more of the thickness of the NAND 42 in the Z direction.

Figure 7:
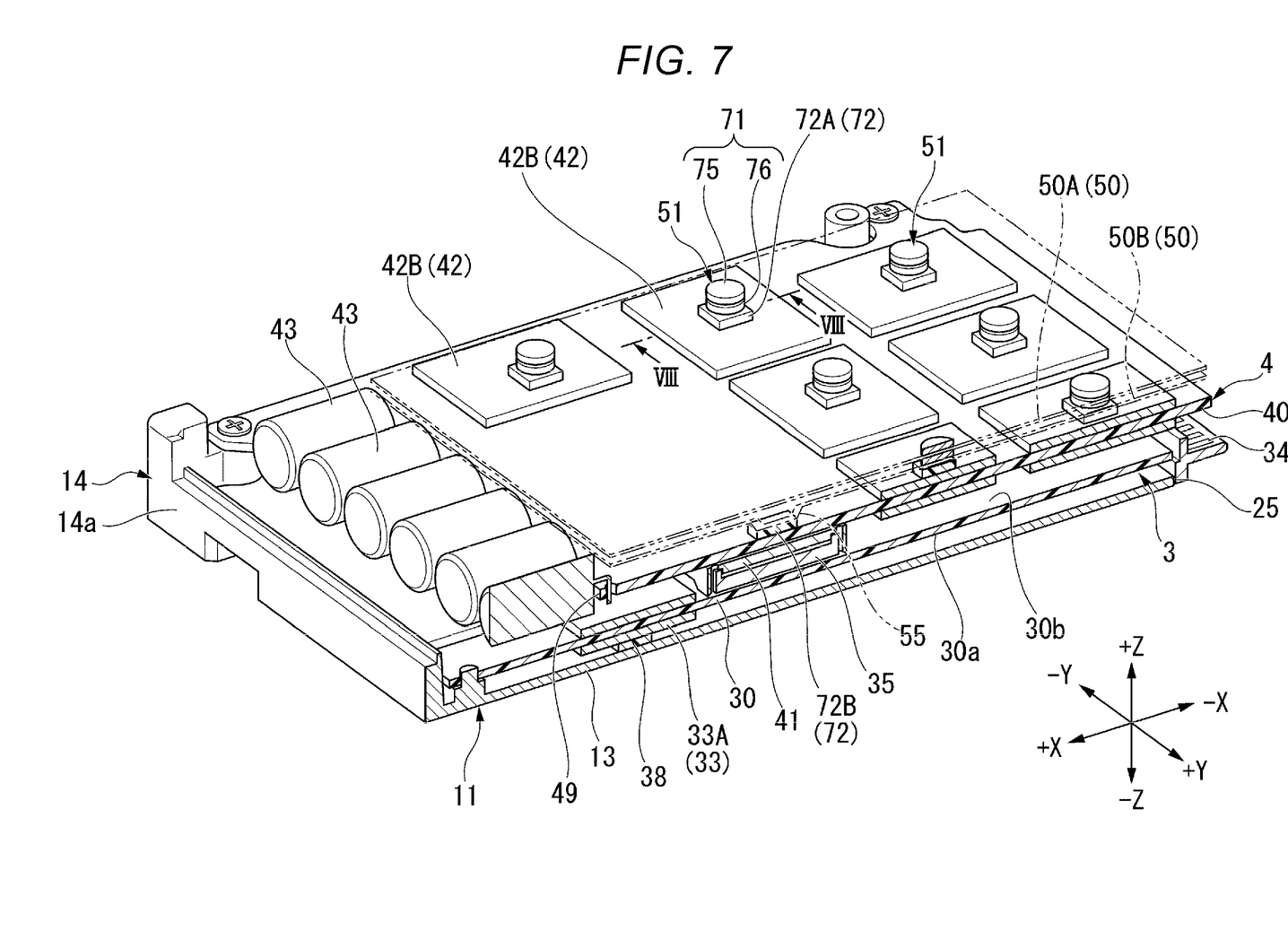
FIG. 7 is a perspective cross-sectional view of a semiconductor storage device in a state in which a cover is removed.

As illustrated in FIG. 6, a plurality of capacitors 43 are mounted on the child substrate 40 in a state of being accommodated in the notch 49 of the child substrate 40. The plurality of capacitors 43 are arranged along the Y direction in the notch 49. As illustrated in FIG. 7, a gap between two capacitors 43 adjacent to each other in the Y direction gradually widens from the center portion toward the +Z side or the −Z side. As illustrated in FIG. 2, the capacitor 43 protrudes on both sides in the Z direction with respect to the child substrate 40. For example, the amount of protrusion H1 of the capacitor 43 with respect to the first surface 40*a* of the child substrate 40 to the −Z side is smaller than the amount of protrusion H2 of the capacitor 43 with respect to the second surface 40*b* of the child substrate 40 to the +Z side. For example, the amount of protrusion H2 of the capacitor 43 with respect to the second surface 40*b* of the child substrate 40 is larger than the amount of protrusion H3 of the NAND 42B with respect to the second surface 40*b* of the child substrate 40. The amount of protrusion H3 of the NAND 42B is the thickness of the NAND 42B in the Z direction. For example, the amount of protrusion H2 of the capacitor 43 is two times or more than the amount of protrusion H3 of the NAND 42B. For example, the amount of protrusion H2 of the capacitor 43 is larger than the gap between the first surface 30*a* of the main substrate 30 and the first main wall 13 in the Z direction. The end portion of the capacitor 43 of the cover side substrate module 4 on the −Z side is separated from the NAND 33B of the base side substrate module 3 in the Z direction.

Next, the heat radiating module 5 will be described. The heat radiating module 5 radiates the heat generated by the cover side substrate module 4. As illustrated in FIG. 2, the heat radiating module 5 is disposed between the first main wall 15 and the child substrate 40 in the housing 2. The heat radiating module 5 covers the cover side substrate module 4 from the +Z side at a location shifted to the −X side with respect to the capacitor 43. The heat radiating module 5 may be separated from the housing 2 as long as the heat radiating module 5 is in contact with the cover side substrate module 4. The heat radiating module 5 may be disposed between the base side substrate module 3 and the cover side substrate module 4, for example. The heat radiating module 5 may be disposed between the base side substrate module 3 and the base 11.

The heat radiating module 5 includes, for example, a plurality of inner plates 50 and a plurality of connection portions 51. The number of inner plates 50 is, for example, two. The number of connection portions 51 is, for example, seven. Hereinafter, the inner plate 50 and the connection portion 51 will be described.

First, the inner plate 50 will be described. The inner plate 50 is a heat sink. The inner plate 50 can also be referred to as a "heat radiating plate". The inner plate 50 radiates the heat generated by the base side substrate module 3. The inner plate 50 is a planar member in an XY plane. Each inner plate 50 has, for example, the X direction as its longitudinal (length) direction and the Y direction as its lateral (width) direction. The inner plate 50 has the Z direction as its thickness direction. The inner plate 50 is parallel to the child substrate 40 and the first main wall 15. A plurality of inner plates 50 are arranged at intervals along the Z direction. A gap between the adjacent inner plates 50 in the Z direction is smaller than the gap between the main substrate 30 and the first main wall 13 in the Z direction. The gap between the plurality of inner plates 50 in the Z direction is also smaller than the gap between the main substrate 30 and the child substrate 40 in the Z direction.

The inner plate 50 has a size sufficient to cover at least all the NAND 42B from the +Z side. For example, the length of the inner plate 50 in the X direction is ½ or more of the length of the main substrate 30 in the X direction. The length of the inner plate 50 in the X direction is ½ or more of the length of the child substrate 40 in the X direction. For example, the length of the inner plate 50 in the Y direction is ½ or more of the length of the main substrate 30 in the Y direction. The length of the inner plate 50 in the Y direction is ½ or more of the length of the child substrate 40 in the Y direction.

The inner plate 50 is made of a material having better (higher) heat conduction properties than the main substrate and the child substrate 40. A material having an excellent heat conduction property is, for example, a metal such as aluminum or copper. The minimum thickness of the inner plate 50 is thinner than the minimum thickness of the main substrate 30 and the child substrate 40. The inner plate 50 is located within the height range of the capacitor 43. A surface on the +Z side of the inner plate 50 closest to the +Z side of the plurality of inner plates 50 (i.e., a first plate 50A) is located more to −Z side than the +Z side end of the capacitor 43. Therefore, the plurality of inner plates 50 overlap with the capacitor 43 in the X direction. The thickness, numbers, layout, or the like of the inner plate 50 may be arbitrarily set, in view of operational and design requirements. For example, only one inner plate 50 may be provided as long as the inner plate 50 and the NAND 42B are connected to each other via the connection portion 51.

The plurality of inner plates 50 include a first plate 50A and a second plate 50B. The first plate 50A and the second plate 50B are parallel to each other.

The first plate 50A is arranged closest to the +Z side of the plurality of inner plates 50. The first plate 50A faces the first main wall 15. A gap between the first plate 50A and the first main wall 15 in the Z direction is smaller than a gap between the main substrate 30 and the second main wall 13 in the Z direction. A gap between the first plate 50A and the first main wall 15 in the Z direction is also smaller than a gap between the main substrate 30 and the child substrate 40 in the Z direction.

The second plate 50B is arranged closest to the −Z side of the plurality of inner plates 50. The second plate 50B faces the cover side substrate module 4. A gap between the second plate 50B and the NAND 42B in the Z direction is smaller than a gap between the main substrate 30 and the second main wall 13 in the Z direction. A gap between the second plate 50B and the NAND 42B in the Z direction is smaller than a gap between the main substrate 30 and the child substrate 40 in the Z direction. A bulged portion 55 is formed in an area of the second plate 50B that overlaps with the internal connector 41. The bulged portion 55 bulges toward the child substrate 40 with respect to the other part of the second plate 50B.

Next, the connection portion 51 will be described. FIG. 7 is a perspective cross-sectional view of the semiconductor storage device 1 in a state in which the cover 12 is removed.

The connection portion 51 is a connector that connects the heat radiating module 5 to the housing 2. The connection portion 51 is in contact with the cover side substrate module 4, the inner plate 50, and the first main wall 15. The connection portion 51 transfers the heat generated by the cover side substrate module 4 to a plurality of inner plates 50 and the first main wall 15. The connection portion 51 is disposed at a location where the connection portion 51 overlaps with the NAND 42B in the Z direction. The connection portion 51 is interposed between the NAND 42B and the first main wall 15. The dimensions of the X direction and Y direction of the connection portion 51 are smaller than the corresponding dimensions of the X direction and the Y direction of the NAND 42. Air flows through a gap between the connection portions 51 adjacent to each other inside the housing 2.

The connection portion 51 includes a fastening portion 71 and a cover side buffer portion 72. The fastening portion is a connector that connects the plurality of inner plates 50 to the first main wall 15. The fastening portion 71 may be in contact with the child substrate 40. The cover side buffer portion 72 is a buffer member or material interposed between the fastening portion 71 and the cover side substrate module 4. The cover side buffer portion 72 is in contact with the fastening portion 71 and the NAND 42B. The cover side buffer portion 72 transfers the heat from the NAND 42B to the fastening portion 71.

Next, the fastening portion 71 will be described. First, a main wall through hole 80, a first through hole 81, and a second through hole 82 will be described, which are through holes for the fastening portion 71 to penetrate the first main wall 15, the first plate 50A, and the second plate 50B.

Figure 8:
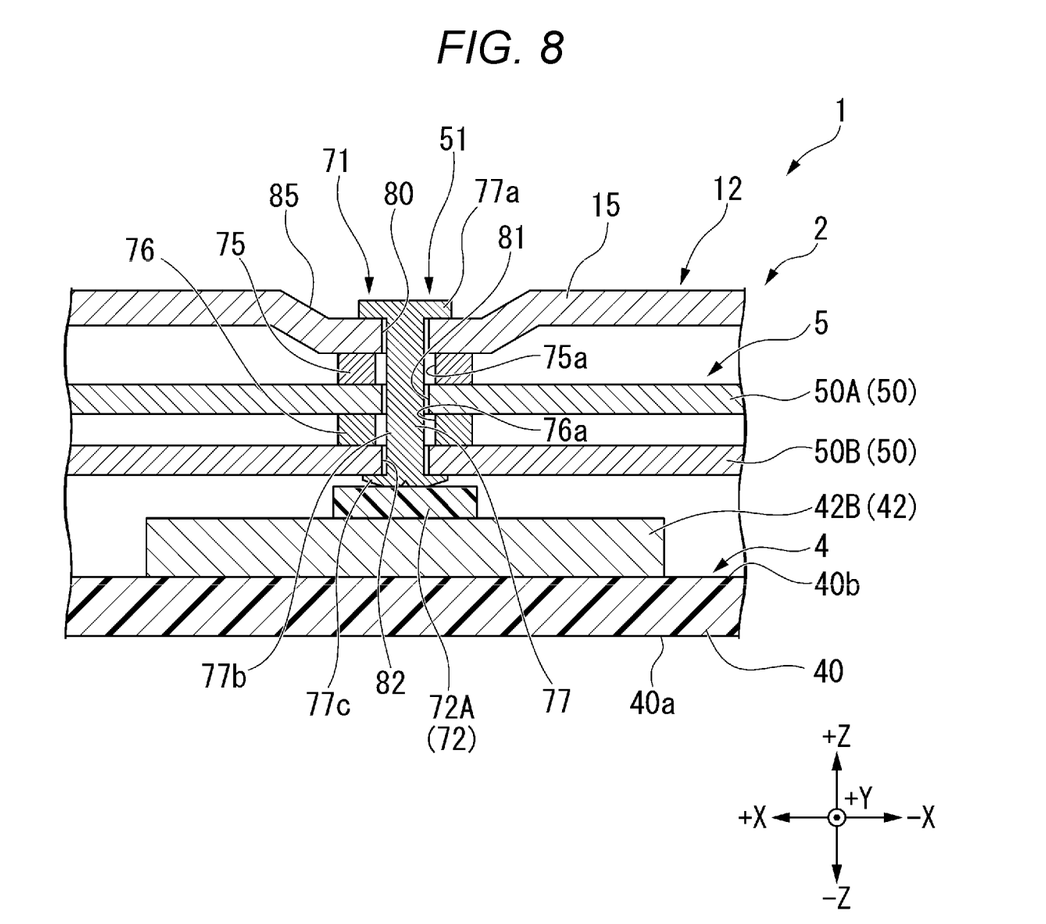
FIG. 8 is a cross-sectional view taken along the line VIII-VIII in FIG. 7.

As illustrated in FIG. 8, the main wall through hole 80 is formed in the first main wall 15. The main wall through hole 80 penetrates the first main wall 15 along the Z direction. The main wall through holes 80 are arranged at intervals in the X direction and the Y direction. A recessed portion 85 may be formed around the main wall through hole 80 of the first main wall 15. In the example of FIG. 8, the main wall through hole 80 is opened at the bottom surface of the recessed portion 85.

The first through hole 81 is formed in the first plate 50A. The first through hole 81 penetrates the first plate 50A along the Z direction. The first through holes 81 are arranged at intervals in the X direction and the Y direction.

The second through hole 82 is formed in the second plate 50B. The second through hole 82 penetrates the second plate 50B along the Z direction. The second through holes 82 are arranged at intervals in the X direction and the Y direction. Of the plurality of main wall through holes 80, the first through holes 81 and the second through holes 82, the corresponding main wall through holes 80, the first through holes 81 and the second through holes 82 overlap when viewed from the Z direction.

The fastening portion 71 includes a first spacer 75, a second spacer 76, and a fastening pin 77. The first spacer 75 maintains a gap between the first main wall 15 and the first plate 50A. The first spacer 75 has a tubular shape extending along the Z direction as the shaft or axial direction. The first spacer 75 is made of a material having an excellent heat conduction quality. The material having an excellent heat conduction quality is, for example, a metal such as aluminum or copper. The first spacer 75 is made of a material having a higher heat conductivity than the main substrate 30 and the child substrate 40. The first spacer 75 is interposed between the first plate 50A and the first main wall 15. The first spacer 75 is in contact with each of the first plate 50A and the first main wall 15. As illustrated in FIG. 7, the outer diameter of the first spacer 75 is smaller than the maximum dimension in the X direction in the NAND 42. The outer diameter of the first spacer 75 is smaller than the maximum dimension in the Y direction in the NAND 42. The first spacer 75 has a first passage hole 75a that penetrates the first spacer 75 in the Z direction. The first passage hole 75a communicates with the first through hole 81 and the main wall through hole 80.

The second spacer 76 maintains a gap between the first plate 50A and the second plate 50B. The second spacer 76 has a tubular shape extending along the Z direction (i.e., the shaft direction). The second spacer 76 is made of a material having an excellent heat conduction quality. A material having an excellent heat conduction quality is, for example, a metal such as aluminum or copper. The second spacer 76 is made of a material having a higher heat conductivity than the main substrate 30 and the child substrate 40. The second spacer 76 is disposed so as to have the same axis with the first spacer 75 between the first plate 50A and the second plate 50B. The second spacer 76 is interposed between the first plate 50A and the second plate 50B. The second spacer 76 is in contact with each of the first plate 50A and the second plate 50B. The second spacer 76 has a second passage hole 76a that penetrates the second spacer 76 along the Z direction. The second passage hole 76a of the second spacer 76 communicates with the first through hole 81 and the second through hole 82. As illustrated in FIG. 7, the outer diameter of the second spacer 76 is equivalent to the outer diameter of the first spacer 75.

The fastening pin 77 is a so-called caulking pin. The fastening pin 77 is made of a material having an excellent heat conduction quality. A material having an excellent heat conduction quality is, for example, a metal such as aluminum or copper. The fastening pin 77 is made of a material having a higher heat conductivity than the main substrate 30 and the child substrate 40.

The fastening pin 77 includes a head portion 77a and a shaft portion 77b. The head portion 77a is an end portion of the fastening pin 77 on the +Z side. The head portion 77a projects from the shaft portion 77b in a flange shape. A part of the head portion 77a faces the first main wall 15, the first spacer 75, and the second spacer 76 in the Z direction. The head portion 77a contacts the first main wall 15 from a side opposite to the first spacer 75 with respect to the first main wall 15. The head portion 77a is disposed in the recessed portion 85. The shaft portion 77b penetrates the main wall through hole 83, the first passage hole 75a, the first through hole 81, the second through hole 82, and the second passage hole 76a along the Z direction.

A caulking portion 77c is formed at the front end portion of the shaft portion 77b. The caulking portion 77c is an end portion of the fastening pin 77 on the −Z side. The caulking portion 77c is formed by being plastically deformed so that the end portion of the shaft portion 77b on the −Z side is widened toward the outer peripheral side after the shaft portion 77b is inserted into the main wall through hole 83, the first passage hole 75a, the first through hole 81, the second through hole 82, and the second passage hole 76a. The caulking portion 77c projects from the opening edge of the second through hole 82. A part of the caulking portion 77c (more particularly, a part projecting from the opening edge of the second through hole 82) faces the head portion 77a, the first main wall 15, the first spacer 75, and the second spacer 76 in the Z direction. The caulking portion 77c is in contact with the second plate 50B from a side opposite to the second spacer 76 with respect to the second plate 50B.

As a result, the first main wall 15 and each inner plate 50 are sandwiched between the head portion 77a and the caulking portion 77c with a gap between the first plate 50A and the first main wall 15 and between two adjacent inner plates 50. It is preferable that a gap between the plurality of inner plates 50 overlaps at least one of the first communication hole 22 and the second communication hole 23 or a gap between the plurality of capacitors 43 adjacent to each other in the Y direction, in the X direction. It is preferable that a gap between the first plate 50A and the first main wall 15 overlaps at least one of the first communication hole 22 and the second communication hole 23 or a gap between the plurality of capacitors 43 adjacent to each other in the Y direction, in the X direction. It is preferable that a gap between the second plate 50B and the child substrate 40 overlaps at least one of the first communication hole 22 and the second communication hole 23 or a gap between the plurality of capacitors 43 adjacent to each other in the Y direction, in the X direction. The fastening pin 77 may be assembled in a state in which the head portion 77a is located on the −Z side and the caulking portion 77c is located on the +Z side.

Next, the cover side buffer portion 72 will be described. The cover side buffer portion 72 has a buffering function and a heat conduction function. The cover side buffer portion 72 is a so-called thermal interface material (TIM). The cover side buffer portion 72 has a sheet shape having a thickness in the Z direction. The cover side buffer portion 72 is made of a resin material having an excellent heat conduction quality and greater elasticity than the first spacer 75, the second spacer 76, the main substrate 30, and the child substrate 40. The cover side buffer portion 72 is made of a material having a higher heat conductivity than, for example, the main substrate 30 and the child substrate 40. The cover side buffer portion 72 may be grease, an adhesive, or the like. The cover side buffer portion 72 is an example of a heat conductive member.

There are two types of cover side buffer portions 72, a first buffer portion 72A and a second buffer portion 72B. The first buffer portion 72A is a cover side buffer portion 72 located between the second plate 50B and the NAND 42B. As illustrated in FIG. 8, the first buffer portion 72A is interposed between the caulking portion 77c of the fastening pin 77 and the NAND 42B. The first buffer portion 72A is in contact with the caulking portion 77c of the fastening pin 77 and the NAND 42B. The first buffer portion 72A may be in contact with the second plate 50B and the NAND 42B therebetween.

The second buffer portion 72B is a cover side buffer portion 72 located between the child substrate 40 and the bulged portion 55. The second buffer portion 72B is in contact with the bulged portion 55 and the child substrate 40. The bulged portion 55 faces a part of the child substrate 40 that overlaps the internal connector 41 in the Z direction via the second buffer portion 72B. The bulged portion 55 prevents the cover side substrate module 4 from being displaced to the +Z side with respect to the base side substrate module 3 while the connection between the internal connector 35 of the base side substrate module 3 and the internal connector 41 of the cover side substrate module 4 is secured.

Next, an operation of the semiconductor storage device 1 will be described.

A part of the heat generated by the NAND 42A or 42B is transferred to the plurality of inner plates 50 and the cover 12 through the first buffer portion 72A and the fastening portion 71. As a result, the heat generated by the NAND 42A or 42B is efficiently radiated. Further, the temperature rise of the cover side substrate module 4 is prevented.

Further, air flowing from the +X side to the −X side with respect to the semiconductor storage device 1, for example, flows into the housing 2 through the first communication hole 22. The air that flows into the housing passes around the capacitor 43 and reaches the heat radiating module 5. The air passing around the capacitor 43 flows through the part of the gap between the capacitors adjacent to each other in the Y direction, which is located on the +Z side.

The air that has reached the heat radiating module 5 further flows to the −X side through a gap between the plurality of inner plates 50 adjacent to each other in the Z direction, a gap between the first plate 50A and the first main wall 15, and a gap between the second plate 50B and the child substrate 40. As a result, the heat is radiated from the heat radiating module 5. The air that has passed through the heat radiating module 5 is discharged from the housing 2 through the second communication hole 23.

The heat generated in the base side substrate module 3 is transferred to the base 11 via the base side buffer portion 38 or to the cover side substrate module 4 via the internal connector 35. A part of the heat transferred to the cover side substrate module 4 is radiated by being transferred to the plurality of inner plates 50 and the cover 12 via the cover side buffer portion 72 as described above.

Next, the advantageous effects achieved by the aforementioned embodiments will be described.

The semiconductor storage device 1 includes the plurality of inner plates 50 arranged along the Z direction at locations facing the cover side substrate module 4 in the Z direction in the housing 2, and the connection portion 51 that is in contact with the cover side substrate module 4 and the plurality of inner plates 50. According to this configuration, a part of the heat generated in the cover side substrate module 4 can be transferred to the plurality of inner plates 50 through the connection portion 51. As a result, the heat radiation can be improved as compared with a configuration without an inner plate 50. Further, the temperature rise of the cover side substrate module 4 can be reduced or limited.

In the semiconductor storage device 1, the connection portion 51 is in contact with the NAND 42B, which is the main heat generating source of the semiconductor storage device 1. According to this configuration, the heat generated by the NAND 42B is easily transferred to the plurality of inner plates 50 via the connection portion 51. As a result, the heat generated by the cover side substrate module 4 can be efficiently radiated. Further, the heat radiation is improved.

In the above-described embodiments, the plurality of connection portions 51 are in contact with the plurality of NANDs 42B separately. According to this configuration, the heat generated by each NAND 42B can be efficiently transferred to the plurality of inner plates 50 through each connection portion 51. As a result, the heat radiation is improved.

In the above-described embodiments, the connection portion 51 is in contact with the housing 2 (more particularly, the first main wall 15). According to this configuration, a part of the heat transferred to the connection portion 51 is transferred to the housing 2 and then radiated from the housing 2. As a result, the heat radiation is improved.

In the above-described embodiments, the inner plate 50 is disposed between the cover side substrate module 4 and the first main wall 15. According to this configuration, the heat transferred to the inner plate 50 can be easily transferred to the first main wall 15. As a result, it is possible to prevent the heat generated in the housing 2 from staying in the housing 2.

In the above-described embodiments, the inner plate is disposed at a location where the inner plate 50 overlaps the capacitor 43 in the X direction. As a result, it is possible to provide a semiconductor storage device that is compact and has excellent heat radiating performance.

In the above-described embodiments, the first side wall 18a of the housing 2 has the first communication hole 22 through which the inside and the outside of the housing communicate with each other. According to this configuration, by exchanging the heat between the air flowing into the housing 2 through the first communication hole 22 and the heat radiating module 5, the heat of the heat radiating module 5 can be more effectively radiated.

In the above-described embodiments, the connection portions 51 (or more particularly, fastening portions 71) are arranged at intervals from each other in the X direction and Y direction. According to this configuration, the heat generated by the cover side substrate module 4 can be transferred to the inner plate 50. As a result, the heat radiation is improved.

In the above-described embodiments, the connection portion 51 includes the second spacer 76 interposed between two inner plates 50 adjacent to each other in the Z direction. According to this configuration, a gap between two inner plates 50 adjacent to each other in the Z direction can be maintained. As a result, air can be circulated between the two inner plates 50 adjacent to each other in the Z direction. Further, a sufficient space can be secured for a large surface area of the heat radiating module 5.

In above-described embodiments, the fastening pin 77 holds the inner plate 50, the first spacer 75, and the second spacer 76 together. According to this configuration, the heat radiating module 5 is integrally assembled by the fastening pin 77. Therefore, it is easy to assemble the heat radiating module 5 to the semiconductor storage device 1.

In the semiconductor storage device 1, the heat radiating module 5 is fixed to the housing 2 by the fastening pin 77. According to this configuration, heat can be radiated to the housing 2 through the fastening pin 77. Further, the housing 2 can be reinforced by the heat radiating module 5.

In the above-described embodiments, the buffer portion 72 is interposed between the second plate 50B and the NAND 42. According to this configuration, the impact resistance can be improved. Further, the component tolerances can be absorbed.

In the above-described embodiments, the minimum distance D1 between the NAND 42B and the first main wall 13 is larger than the minimum distance D2 between the NAND 33A and the first main wall 15. According to this configuration, it is possible to allocate a space where the heat radiating module 5 is disposed.

Second Embodiment

Figure 9:
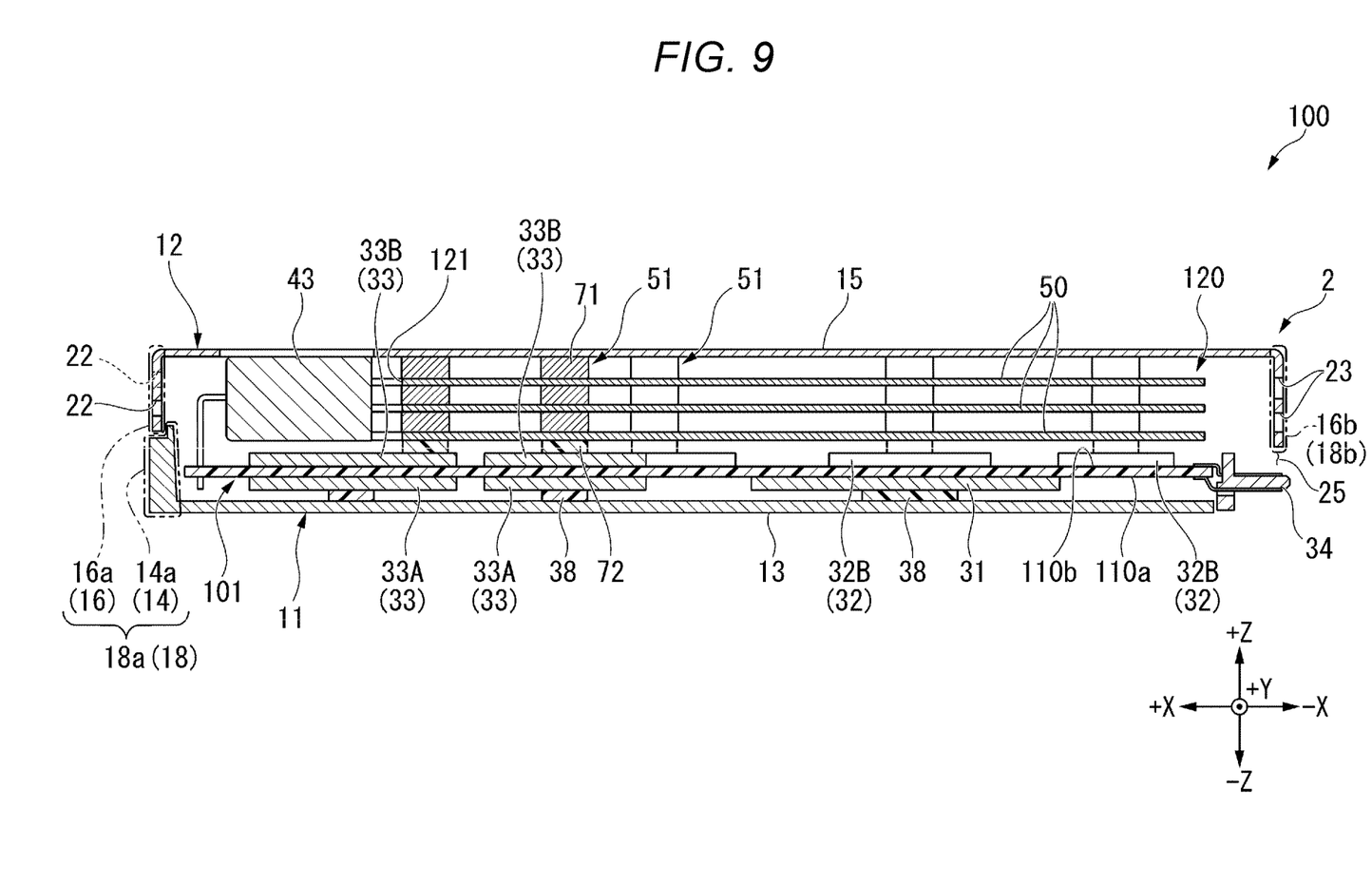
FIG. 9 is a cross-sectional view of a semiconductor storage device of a second embodiment.

FIG. 9 is a cross-sectional view of the semiconductor storage device 100 according to a second embodiment. As illustrated in FIG. 9, the semiconductor storage device 100 includes a housing 2, a substrate module 101, and a heat radiating module 120. The semiconductor storage device 100 is different from the first embodiment described above in that the substrate module 101 is used instead of the base side substrate module 3 and the cover side substrate module 4. In the semiconductor storage device 100, the substrate module 101 is located more to -Z side (that is, on the base 11 side) than is the center portion in the Z direction in the housing 2.

Figure 10:
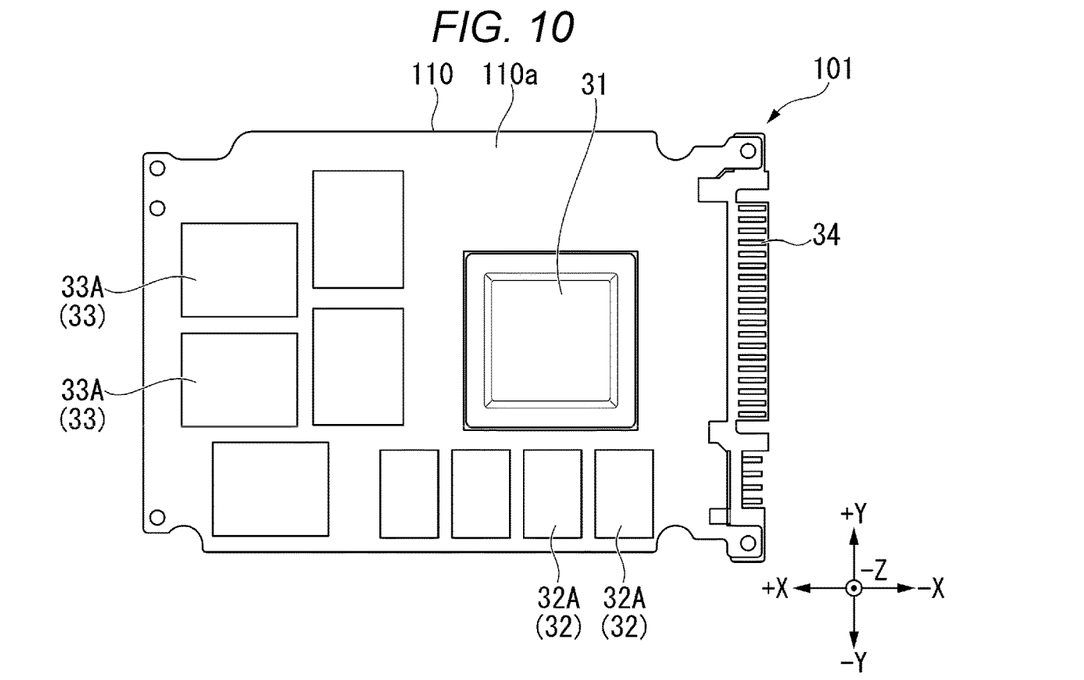
FIG. 10 is a bottom view of a substrate module of a second embodiment.

FIG. 10 is a bottom view of the substrate module 101. As illustrated in FIG. 10, the substrate module 101 is an electronic circuit mounting substrate. The substrate module 101 includes, for example, a substrate 110, a controller 31, a plurality of DRAMs 32, a plurality of NANDs 33, an external connector 34, and a capacitor 43. The substrate module 101 is also referred to as the first substrate module.

The substrate 110 is, for example, a printed wiring substrate. The substrate 110 is also referred to as the "first substrate". The substrate 110 has a rectangular planar shape with the X direction as its longitudinal (length) direction and the Y direction as its lateral (width) direction when viewed from the Z direction. As illustrated in FIG. 9, the substrate 110 is disposed in the housing 2 with the Z direction as its thickness direction. The substrate 110 is disposed in parallel with the second main wall 13 and the first main wall 15. The substrate 110 is fixed to the base 11 with screws or the like. The substrate 110 includes a first surface 110a and a second surface 110b. The first surface 110a faces the second main wall 13. The second surface 110b is located on a side opposite to the first surface 110a. The second surface 110b faces the heat radiating module 120.

As illustrated in FIG. 10, the controller 31 is mounted on the first surface 110a of the substrate 110 on the -X side with respect to the center portion of the substrate 110. The plurality of DRAMs 32A are arranged on the first surface 110a at intervals along the X direction. The plurality of DRAMs 32 are located on the -Y side with respect to the center portion of the substrate 110 (see FIG. 11). The plurality of DRAMs 32B are arranged on the second surface 110b at intervals along the X direction.

A plurality of NANDs 33A are arranged on the first surface 110a at intervals along the X direction and the Y direction. A plurality of NANDs 33B are arranged on the second surface 110b at intervals along the X direction and the Y direction. A plurality of NANDs 33B are also referred to as the "first electronic components".

Figure 11:
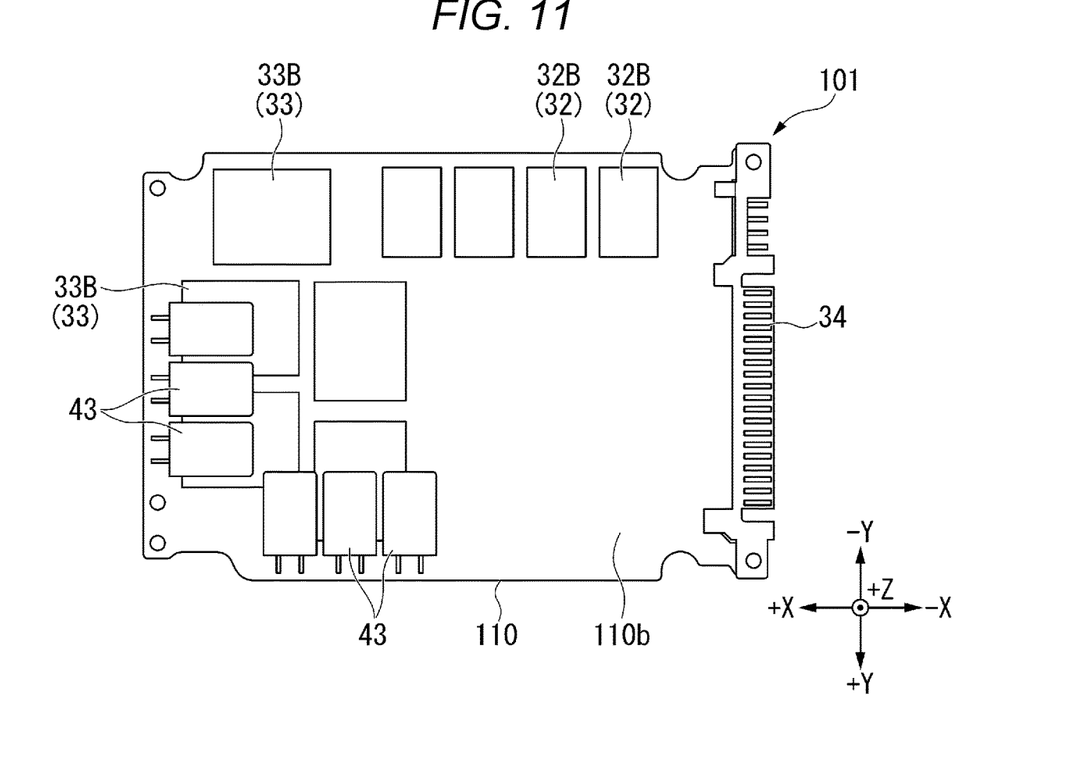
FIG. 11 is a plan view of a substrate module of a second embodiment.

FIG. 11 is a plan view of the substrate module 101. As illustrated in FIG. 11, the plurality of capacitors 43 are arranged on the outer peripheral part of the second surface 110b of the substrate 110 along the X direction and the Y direction. A part of each capacitor 43 overlaps with the NAND 33B when viewed from the Z direction.

The heat radiating module 120 is a heat radiating member. The heat radiating module 120 has a function of radiating heat generated by the substrate module 101, for example. As illustrated in FIG. 9, the heat radiating module 120 includes a plurality of inner plates 50 and a plurality of connection portions 51. For example, the plurality of inner plates 50 include three inner plates 50 arranged at intervals along the Z direction. A relief portion 121 is formed at an end of each inner plate 50 on the +X side. The relief portion 121 is a notch that prevents the inner plate 50 from interfering with the capacitor 43. In other words, a part of each inner plate 50 is located more to the +X side than is the -X side end portion of the capacitor 43.

Each connection portion 51 includes a fastening portion 71 and a buffer portion 72. The plurality of connection portions 51 are arranged at intervals along the X direction and the Y direction. The connection portion 51 is in contact with the DRAM 32B, the NAND 33B, and the substrate 110 via the buffer portion 72.

In the semiconductor storage device 100, only one substrate module 101 is accommodated in the housing 2. As a result, it is easy to allocate a space where the heat radiating module is disposed, in the housing 2. Therefore, the heat radiation can be further improved.

According to at least one embodiment described above, a housing, a first substrate module, a plurality of heat radiating plates, and one or more connection portions are provided. The first substrate module includes a first substrate and one or more first electronic components. The first substrate module is accommodated in the housing. The plurality of heat radiating plates are arranged in the housing in a thickness direction of the first substrate at locations facing the first substrate module in the thickness direction of the first substrate. One or more connection portions are in contact with the first substrate module and the plurality of heat radiating plates. According to this configuration, the heat radiation can be improved.

The specifically described embodiments are merely examples and the scope of the present disclosure is not limited thereto.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a housing including a first wall;
a first substrate facing the first wall in the housing, one or more first electronic components being mounted on the first substrate, one or more second electronic components being arranged on the first substrate and having a greater height than the first electronic components with respect to the first substrate;
a plurality of heat radiating plates arranged between the first substrate and the first wall in the housing above the first substrate in a thickness direction of the first substrate; and
one or more connectors that connect the first substrate and the plurality of heat radiating plates, wherein one of the connectors is in direct contact with one of the first electronic components,
wherein the heat radiating plates are disposed at heights lower than the height of the second electronic components.

2. The semiconductor storage device according to claim 1, wherein the connectors are in direct contact with the respective first electronic components.

3. The semiconductor storage device according to claim 1, wherein the connectors are in direct contact with the housing.

4. The semiconductor storage device according to claim 3, wherein the first wall contacts the connectors.

5. The semiconductor storage device according to claim 4, wherein the connectors are in direct contact with the first wall and the heat radiating plates.

6. The semiconductor storage device according to claim 1, wherein the housing includes a first side wall that is parallel to the thickness direction and includes one or more first communication holes.

7. The semiconductor storage device according to claim 6, wherein the housing includes a second side wall that faces the first side wall and includes one or more second communication holes.

8. The semiconductor storage device according claim 7, wherein the heat radiating plates are located between the first and second communication holes.

9. The semiconductor storage device according to claim 6, wherein the connectors are arranged on the first substrate to be spaced apart from each other in a first direction and a second direction crossing the first direction.

10. The semiconductor storage device according to claim 1, wherein each of the connectors includes one or more spacers interposed between two of the heat radiating plates that are adjacent to each other in the thickness direction.

11. The semiconductor storage device according to claim 10, wherein each of the connectors includes a pin that penetrates the heat radiating plates and the spacers and holds the heat radiating plates and the spacers together.

12. The semiconductor storage device according to claim 11, wherein the pin is fixed to the housing.

13. The semiconductor storage device according to claim 10, wherein the connectors include a heat conductor that is interposed between the first substrate and one of the heat radiating plates located closest to the first substrate, the heat conductor having more elasticity than the spacers.

14. The semiconductor storage device according to claim 1, further comprising:
a second substrate disposed below the first substrate in the housing and on which one or more third electronic components are mounted, wherein
a minimum distance between the first electronic components and the housing is larger than a minimum distance between the third electronic components and the housing.

15. The semiconductor storage device according to claim 14, wherein the first and third electronic components are NAND memories.

16. A semiconductor storage device, comprising:
a housing including a first wall;
a substrate facing the first wall in the housing, one or more first electronic components being mounted on the substrate, one or more second electronic components being arranged on the first substrate and having a greater height than the first electronic components with respect to the first substrate;
one or more heat radiating plates arranged between the first substrate and the first wall in the housing in a thickness direction of the substrate above the substrate; and
one or more connectors connecting the first electronic components and the heat radiating plates, wherein
one of the connectors is in direct contact with one of the first electronic components, and
the heat radiating plates are disposed at heights lower than the height of the second electronic components.

* * * * *